United States Patent
Abou-Kandil et al.

(10) Patent No.: US 8,916,409 B2
(45) Date of Patent: Dec. 23, 2014

(54) PHOTOVOLTAIC DEVICE USING NANO-SPHERES FOR TEXTURED ELECTRODES

(75) Inventors: Ahmed Abou-Kandil, Elmsford, NY (US); Keith E. Fogel, Hopewell Junction, NY (US); Augustin J. Hong, White Plains, NY (US); Jeehwan Kim, Los Angeles, CA (US); Hisham S. Mohamed, Clifton Park, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/275,936

(22) Filed: Oct. 18, 2011

(65) Prior Publication Data
US 2013/0095599 A1    Apr. 18, 2013

(51) Int. Cl.
*H01L 21/00*    (2006.01)
*H01L 31/0236*    (2006.01)

(52) U.S. Cl.
CPC .......... *H01L 31/02366* (2013.01); *Y02E 10/50* (2013.01)

USPC ........... 438/71; 438/69; 438/98; 257/E21.46; 257/E21.51; 257/E31.03; 257/E31.04; 257/E31.12

(58) Field of Classification Search
CPC ................... H01L 31/022425; H01L 31/1804
USPC .................................. 438/87, 72, 98, 69, 71
See application file for complete search history.

(56) References Cited

U.S. PATENT DOCUMENTS

| | | | | |
|---|---|---|---|---|
| 5,668,050 | A * | 9/1997 | Iwasaki | 438/69 |
| 8,202,747 | B2 * | 6/2012 | Liepold | 438/29 |
| 2002/0096254 | A1 * | 7/2002 | Kober et al. | 156/307.3 |
| 2007/0151596 | A1 * | 7/2007 | Nasuno et al. | 136/256 |
| 2007/0169805 | A1 * | 7/2007 | Sasaki et al. | 136/256 |
| 2009/0153026 | A1 * | 6/2009 | Tchakarov et al. | 313/503 |
| 2010/0307552 | A1 * | 12/2010 | Kohnke et al. | 136/243 |

* cited by examiner

*Primary Examiner* — Lex Malsawma
*Assistant Examiner* — Eric Jones
(74) *Attorney, Agent, or Firm* — Tutunjian & Bitetto, P.C.; Louis J. Percello (57) ABSTRACT

An electronic device includes a substrate and a plurality of particles anchored to the substrate. An electrode material is formed over the particles and configured to form peaks over the particles. One or more operational layers are fog led over the electrode material for performing a device function.

14 Claims, 5 Drawing Sheets

PHOTOVOLTAIC DEVICE USING NANO-SPHERES FOR TEXTURED ELECTRODES

BACKGROUND

1. Technical Field

The present invention relates to photovoltaic structures and methods for fabricating the same, and more particularly to employing shaped structures to form textured electrodes.

2. Description of the Related Art

Solar panels employ photovoltaic cells to generate current flow. When a photon hits silicon, the photon may be transmitted through the silicon, reflected off the surface, or absorbed by the silicon if the photon energy is higher than the silicon band gap value. This generates an electron-hole pair and sometimes heat, depending on the band structure. The greater the absorption the greater the efficiency of the cell.

Textured structures have been employed to increase the absorption efficiency. However, challenges arise at several points in the process. One such problem includes the formation of a bottom electrode. A bottom electrode deposition occurs by forming a thick layer of electrode material and deep reactive ion etching (DRIE) the material to attempt to conform the bottom electrode material to the shape of the underlying structure. DRIE is a highly anisotropic etch process making the formation of the bottom electrode highly sensitive to thickness variations. A bottom electrode that is too thin results in series resistance problems and affects the efficiency of the solar cell.

SUMMARY

An electronic device includes a substrate and a plurality of particles anchored to the substrate. An electrode material is formed over the particles and configured to form peaks over the particles. One or more operational layers are formed over the electrode material for performing a device function.

A photovoltaic device includes a substrate and a plurality of spheres anchored to the substrate. An electrode material is formed over the spheres and configured to form peaks over the spheres. A p-i-n stack is conformally formed over the electrode material for absorbing and converting radiation to current flow. A second electrode is formed over the p-i-n stack.

A method for forming a textured electrode for an electronic device includes anchoring a plurality of particles to a substrate; depositing an electrode material over the particles; etching the electrode material to form peaks over the particles; and forming one or more operational layers over the electrode material for performing a device function.

A method for forming a textured electrode for a photovoltaic device includes anchoring a plurality of spheres to a substrate; depositing an electrode material over the spheres; etching the electrode material to form peaks over the spheres; conformally forming a p-i-n stack over the electrode material for absorbing and converting radiation to current flow; and forming a second electrode over the p-i-n stack.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, devices and methods for fabricating electronic devices are provided. The devices employ a substrate layer having prefabricated structures configured to provide a vertical component for forming a textured surface. The vertical component may include a sphere or other structure formed on the substrate layer. In one embodiment, an electrode material is deposited over the structures so that the vertical component provides peaks and valleys in the electrode material that increase the likelihood of absorption of radiation. In this way, the structures provide a method that does not require expensive lithographic patterning and results in higher absorption efficiency. The peaks and valleys may be etched to enhance their aspect ratio and increase absorption efficiency. The etch takes advantage of the geometric gaps and crevices in the layer due to the underlying structures to provide a more textured electrode. In one embodiment, active radiation absorbing layers may be formed on the textured surface.

In accordance with the present principles, devices and methods for fabricating a textured electrode are provided. The devices employ a substrate layer having structures configured to provide a vertical component of a radiation absorption layer. The vertical component may be provided by nano or microspheres, nano or micro hemispheres, or other formed or deposited structures that can provide a depth to increase the likelihood of absorption of the radiation.

In one embodiment, nanospheres are formed and anchored to a substrate layer, e.g., a glass substrate, in a uniform pattern. A deposition process is employed to form an electrode material on and over the nanospheres. It should be understood that active photovoltaic layers may be deposited before or after to the electrode material as needed. An etch process is employed to form a textured surface in the electrode materials. In this way, expensive lithographic patterning or seeding of pillars is avoided. The size and density of the nanospheres in accordance with the present principles are well controlled and are selected to result in higher light absorption efficiency.

In accordance with particularly useful embodiments, a three-dimensional (3D) structure includes conformal thin film solar cell depositions. These structured solar cells will provide high efficiency with reduced cost. Hole-electron pair collection in, e.g., amorphous silicon (a low lifetime material) takes place within 300–500 nm from its surface. Light, however, can penetrate further than this depth. Therefore, a vertical array of thin amorphous silicon cells (with depth <300 nm) with more than 1 micron height will absorb more light and provide horizontal carrier collection within the distance of less than 300 nm.

Deposition of conformal low carrier life time materials (e.g., amorphous silicon) with thin thicknesses on the 3D-structures provides cost effective structures with low potential damage of the surface and provides better performance. When 3D structures are employed in thin film photovoltaic devices, the thickness needed for planar photovoltaic devices is not necessary. Especially for amorphous Si photovoltaics, the thinner the layer, the less light degradation there is.

It is to be understood that the present invention will be described in terms of given illustrative architectures for a solar cell; however, other architectures, structures, substrate materials, and process features and steps may be varied within the scope of the present invention. Since vertical structures may be sized from, e.g., about 5 nm to a few microns, small spheres can be employed in the formation of a semiconductor quantum transistor device while micron scale spheres are more useful for photovoltaics.

The present embodiments may be part of a photovoltaic device or circuit, and the circuits as described herein may be part of a design for an integrated circuit chip, a solar cell, a light sensitive device, etc. The chip/device design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips and/or solar cells. The resulting integrated circuit chips or cells can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes photovoltaic devices, integrated circuit chips with solar cells, ranging from toys, calculators, solar collectors and other low-end applications to advanced products.

The flowchart and block diagrams in the Figures illustrate the architecture, functionality, and operation of possible implementations of systems, and methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
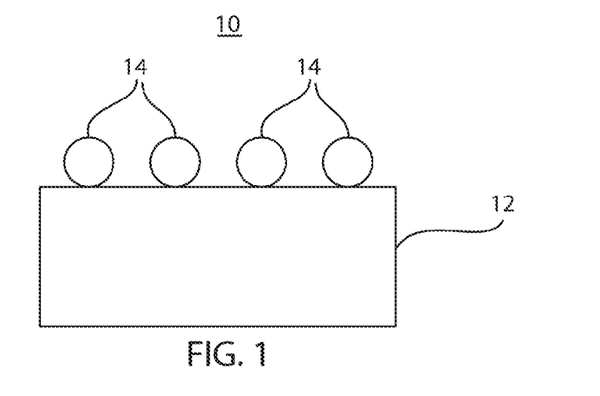
FIG. 1 is a cross-sectional view of a substrate having spheres deposited thereon in accordance with one embodiment.

Referring now to the drawings in which like numerals represent the same or similar elements and initially to FIG. 1, a cross-sectional view is depicted of a substrate or substrate layer 12 having spheres 14 applied thereon. The substrate 12 may include a plurality of different materials, e.g., metal, but is preferably formed from a soft substrate material, such as glass, a polymer or a semiconductor material (e.g., silicon). The substrate 12 is preferably not deformable at processing temperatures used to form a photovoltaic cell or device 10, as will be described. In one embodiment, the substrate 12 includes glass that deforms at temperatures, e.g., above 600 degrees C. The spheres 14 preferably include a material that can also withstand processing temperatures used to form the photovoltaic cell or device 10. The material for spheres 14 may include polymeric polystyrene, silica ($SiO_2$), or metallic materials depending on the specific application or output needed.

The spheres 14 may include nanospheres or microspheres. Microscale or nanoscale spheres may be fabricated independently using known methods. Microscale or the prefix micro—refers to sizes in the range of 1 micron to 1000 microns. Nanoscale or the prefix nano—refers to sizes in the range of 1 nm up to 1000 nm (or up to one micron).

A diametric dimension of spheres 14 may be selected to accommodate a particular application of the device 10. For example, larger spheres 14 may be selected to provide increased light trapping by providing a more textured surface. The spheres 14 may include materials such as silicon dioxide, aluminum oxide, titanium oxide, carbon, metal (with higher melting points, such as aluminum, copper, iron, etc.) and alloys thereof. Other materials may also be employed for spheres 14.

Spheres 14 are preferably anchored on the substrate 12 by electrostatic interaction or Van der Waals forces. Chemical anchoring may also be achieved using substances such as, e.g., MPA (Mercapto Propionic Acid) or APTMS (Aminopropyl Trimethoxy Silane). This may include coating the spheres 14 and/or a surface of the substrate 12 with these materials to enhance anchoring of the spheres 14. In an alternate embodiment, surface cleaning of the substrate followed by a layer by layer (LBL) assembly of the spheres 14 may be employed to provide close packed and anchored spheres 14 on the substrate 12. The spheres 14 preferably include a uniform size however; a plurality of different diameter spheres 14 may also be employed. The spheres 14 may range from a diametric size of about 5 nm to about 100 microns, and more preferably between about 50 nm to few microns (e.g., 1-4 microns) depending on the dimensions needed.

The spheres 14 are formed separately and may be provided from a commercial source. The spheres 14 may be deposited on a surface of the substrate 12 by spraying or other process. The spraying may include electrostatics such that the spheres 14 have a first charge and the substrate 12 may include an opposite charge. The spheres 14 are preferably uniformly distributed on the surface of the substrate 12. In one embodiment, the spheres 14 are close packed so that the spheres 14 are in contact with their nearest neighbors.

Figure 2:
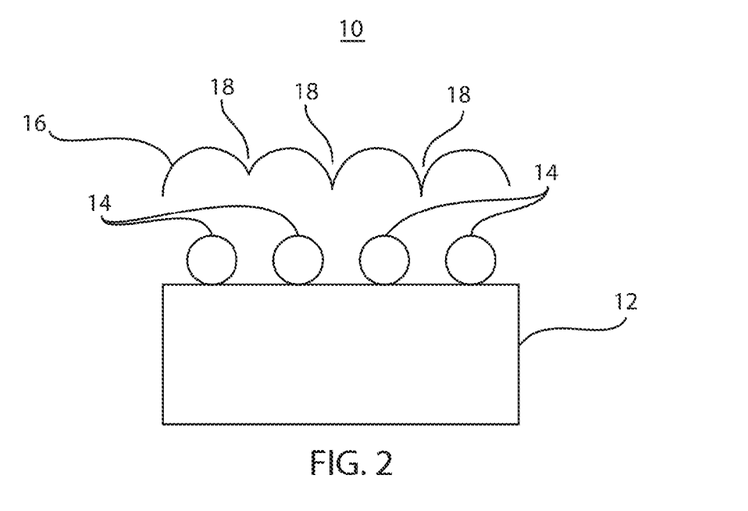
FIG. 2 is a cross-sectional view of the substrate of FIG. 1 having an electrode material formed over the spheres in accordance with one embodiment.

Referring to FIG. 2, an electrode material 16 is deposited over the spheres 14. It is preferable that the material fills spaces between the spheres 14 and between the spheres 14 and the substrate 12. The spheres 14 cause gaps, folds or crevices 18 in an upper surface of the material 16. Material 16 may be deposited by any known methods including sputtering, physical deposition, chemical vapor deposition, thermal or e-beam evaporation, electro- or electroless plating etc. The material 16 may include a thickness of about twice the diameter of the largest sphere 14, although other thicknesses may also be employed. The material 16 may include a conductive transparent oxide (CTE) such as, e.g., zinc oxide, indium tin oxide, indium zinc oxide, a fluorine-doped tin oxide ($SnO_2$:F, or "FTO"), doped zinc oxide (e.g., ZnO:Al), tin oxide or other suitable materials. The material 16 may include a metal, such as aluminum, tungsten, chromium, silver or other metal, which is preferably thin enough to be transparent (e.g., less than about 20 nm).

Figure 3:
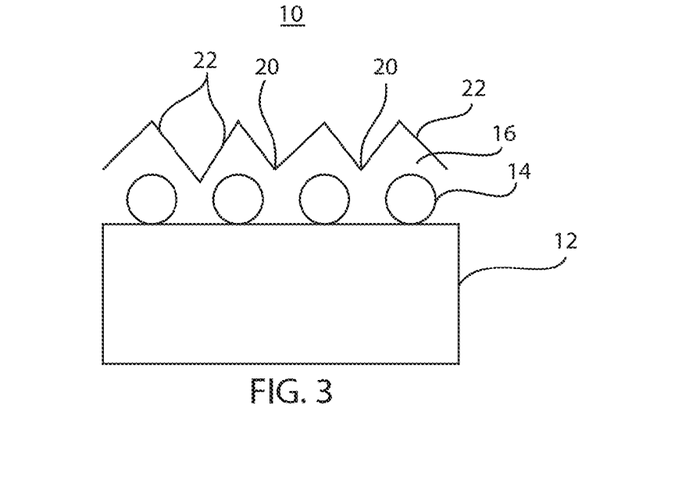
FIG. 3 is a cross-sectional view of FIG. 2 showing the electrode material etched to form a textured surface in accordance with one embodiment.

Referring to FIG. 3, material 16 is etched by employing an etch process. In one embodiment, the etching process may include a deep reactive-ion etching (DRIE). DRIE is a highly anisotropic etch process which may be employed to form deep, steep-sided surfaces approximately centered on the spheres 14. The crevices 18 result in the formation of valleys 20. The DRIE process fabricates tapered walls 22. In one illustrative embodiment, DRIE is employed for a duration of, e.g., 10 minutes using $CF_4$ and $O_2$ to form tapered walls 22 with a height of approximately 2 times that of the diameter of the spheres 14. Etching pressure is preferably between 100 mT and 400 mT, and power in a processing chamber is preferably maintained between about 100 W and about 400 W.

Other etching processes may also be employed. For example, a wet etch process may be employed to reduce the size of the, as deposited, electrode material 16 and to exploit gaps, fissures or crevices 18. The wet etching process results in a simultaneous reduction and narrowing of the shape of the electrode material 16 to provide a more conforming profile. The wet etching process may include a hydrochloric acid (HCl) although other etchants may be employed, e.g., HF, $HNO_3$, HCl, etc. In addition, the wet etching process is much more inexpensive than deep reactive ion etching. The electrode material 16 in this embodiment forms a three-dimensional electrode and includes a textured surface conforming to the spheres 14.

The structure in FIG. 3 may be employed in a semiconductor device, battery, solar cell or any other electronic device. The tapered walls 22 and valleys 20 provide geometric structures which provide increased light trapping and increased short circuit current (Jsc) for photovoltaic devices. While the tapered walls 22 and valleys 20 formed in the material may be employed for other applications, e.g., a battery terminal template, a substrate for a three-dimensional electronic device, etc., preferred embodiments include a solar cell absorption surface, which receives light accordingly to activate light sensitive structures and materials for proper operation of the device.

Figure 4:
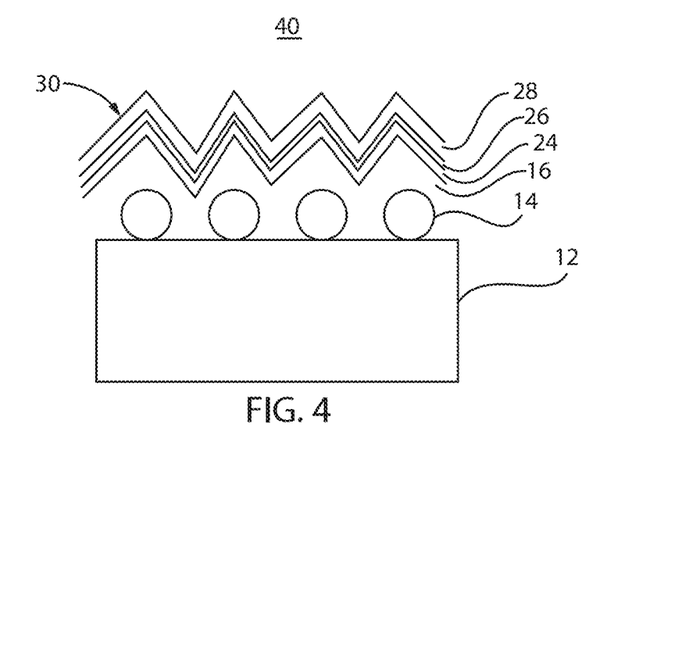
FIG. 4 is a cross-sectional view of FIG. 3 showing a p-i-n stack conformally formed on the textured surface in accordance with one embodiment.

Referring to FIG. 4, in one embodiment, a photovoltaic device 40 is formed by providing a p-layer, intrinsic layer, n-layer stack (or p-i-n stack) on the electrode material 16. The deposition process may include a chemical vapor deposition (CVD) process or other suitable deposition process. A p-i-n stack 30 is formed over the electrode material 16. The pin stack 30 preferably includes a first layer (e.g., p-doped layer) 24, an intrinsic layer (i-layer) 26 and a doped layer (e.g., n-doped layer) 28. The stack 30 may be formed using a CVD process or a plasma enhanced chemical vapor deposition (PECVD) process. The stack 30 provides active areas for absorbing radiation and converting the radiation into charge flow as is known in the art. A plurality of different materials may be selected for the layers in stack 30. In one particularly useful embodiment, the doped layers 24, 28 may include doped polycrystalline/microcrystalline silicon and the intrinsic layer 26 may include undoped amorphous silicon. It should be understood that other layers and features may be included, such as contact layers, etc., or even multiple photovoltaic stacks.

The first layer 24 is formed on or over the electrode material 16 (e.g., transparent conductor as formed over spheres 14). The first layer 24 may include amorphous silicon (e.g., a-Si:H), microcrystalline silicon (μc-Si:H), SiC or other suitable materials, such as, e.g., CIGS (CuInGaS), CdTe, poly Si or other kinds of materials for thin film solar cells. Layer 24 includes p-type characteristics in this embodiment. An intrinsic layer or base layer 26 is formed on layer 24. The intrinsic layer 26 includes a compatible material with layers 24 and 28. The intrinsic layer 26 is preferably undoped. A layer 28 is formed on the intrinsic layer 26, and has an opposite polarity relative to the layer 24 (e.g., if layer 24 is p-type then layer 28 is n-type or vice versa). In this example, layer 28 is an n-type material and layer 24 is a p-type material. Different combinations of material may be employed to form the photovoltaic stack, for example, CdS(n-type)/CIGS(intrinsic (i-type))/ Molybdenum (p-type) on glass 12. Other materials may be employed as well.

Layers 24, 26 and 28 form a single junction (pin stack 30) configured to be light-absorbing of incident radiation. The structure 40 is preferably a silicon thin-film cell, which includes silicon layers which may be deposited by CVD, or PECVD from silane gas and hydrogen gas. Depending on the deposition parameters, amorphous silicon (a-Si or a-Si:H), nanocrystalline silicon (nc-Si or nc-Si:H) or microcrystalline silicon μc-Si:H may be formed.

Figure 5:
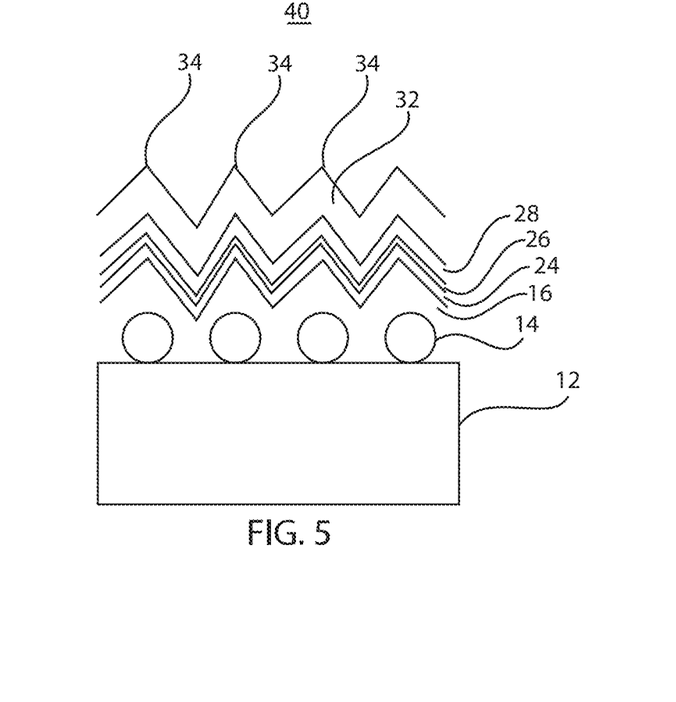
FIG. 5 is a cross-sectional view of FIG. 4 showing a second electrode material formed on the p-i-n stack in accordance with one embodiment.

Referring to FIG. 5, other structures may be formed on the p-i-n stack 30 such as a back-reflector or another electrode layer 32. The back-reflector/electrode layer 32 may include a transparent conductive oxide, such as, ZnO, etc. and/or a metal layer (e.g., a reflective surface) or other layers or structures. The combined thickness of the layers 24, 26 and 28 may be between about 0.1~0.5 microns, although other thicknesses may be employed. For a single junction solar cell, peaks 34 are preferably angular for capturing light and increasing the chance of reabsorbing reflected light.

In illustrative embodiments, structure 100 includes p-type amorphous or microcrystalline silicon (a or μc)-Si:H for layer 104 with a thickness of about 5 nm to about 20 nm. An n-type amorphous or microcrystalline silicon (a or μc)-Si:H for layer 108 includes a thickness of about 5 nm to about 20 nm. In this case, the intrinsic layer 106 includes amorphous or microcrystalline silicon (a or μc)-Si:H and may include a thickness of about 50 nm to about 300 nm. Other dimensions and materials may be employed.

In accordance with the present principles, it should be understood that additional junctions (e.g., pin stacks) may be formed over the single junction of device 40 shown in FIG. 4. The photovoltaic structure(s) may be employed in solar cells, light sensors or other photovoltaic applications. The structures may be constructed to receive light with substrate 12 facing out (e.g., toward the light) or facing in.

Figure 6A:
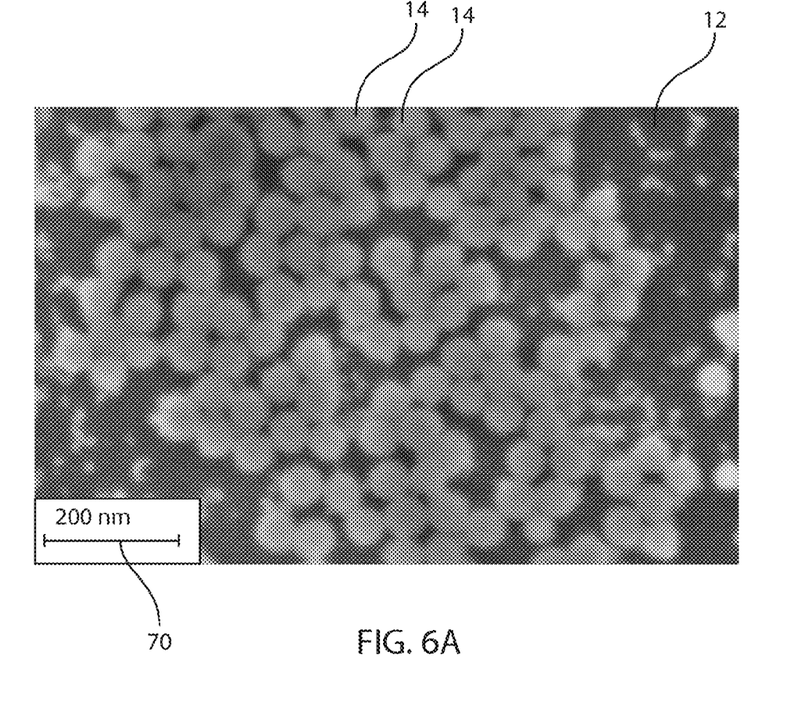
FIGS. 6A and 6B are scanning electron microscope images illustratively showing densely packed spheres, respectively, at two different magnifications in accordance with the present principles.
Figure 6B:
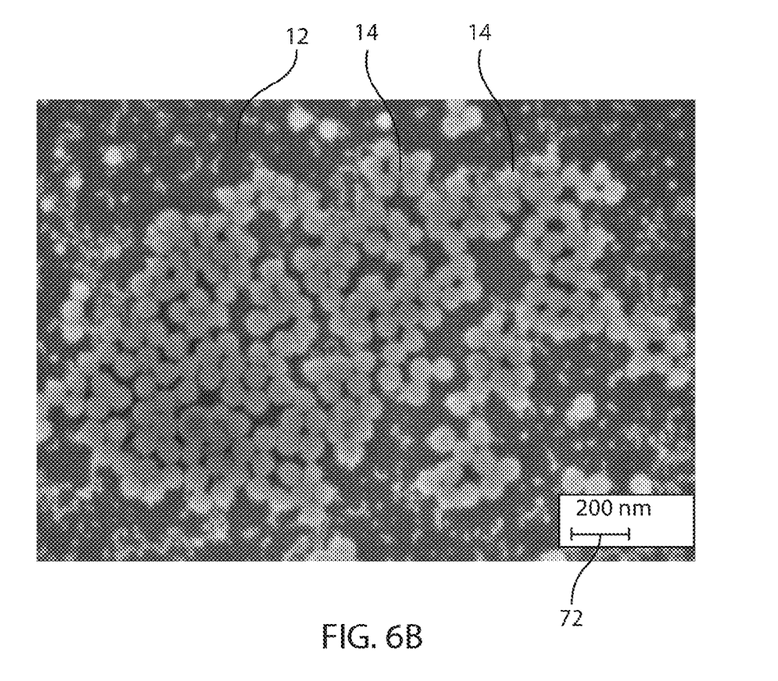

Referring to FIGS. 6A and 6B, scanning electron microscope (SEM) images are illustratively shown for silica nanospheres (14) anchored on a substrate (12). FIG. 6A is a magnified view of FIG. 6B. Dimension scales 70 and 72 for 200 nm are indicated in FIGS. 6A and 6B respectively. By providing additional nanospheres (14), spaces between the nanospheres can be occupied and a single layer of uniform density can be achieved across a surface of the substrate (12).

Figure 7:
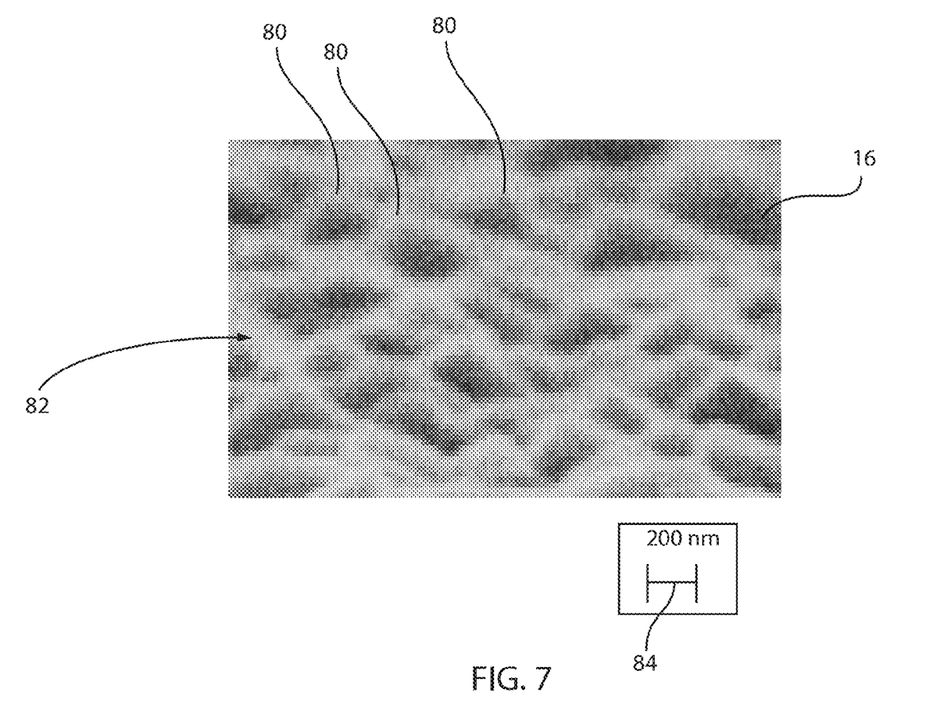
FIG. 7 is a scanning electron microscope image showing a textured surface of electrode materials in accordance with one embodiment.

Referring to FIG. 7, a SEM image illustratively shows electrode material 16 after being deposited over the spheres (14) and etched as described with respect to FIG. 3. A textured surface 82 results having pyramidal shaped peaks 80 formed in the electrode material 16. The pyramid size depends on the size of the underlying sphere used as a scaffold to form the peak 80. A dimension scale 84 (200 nm) is also provided.

Figure 8:
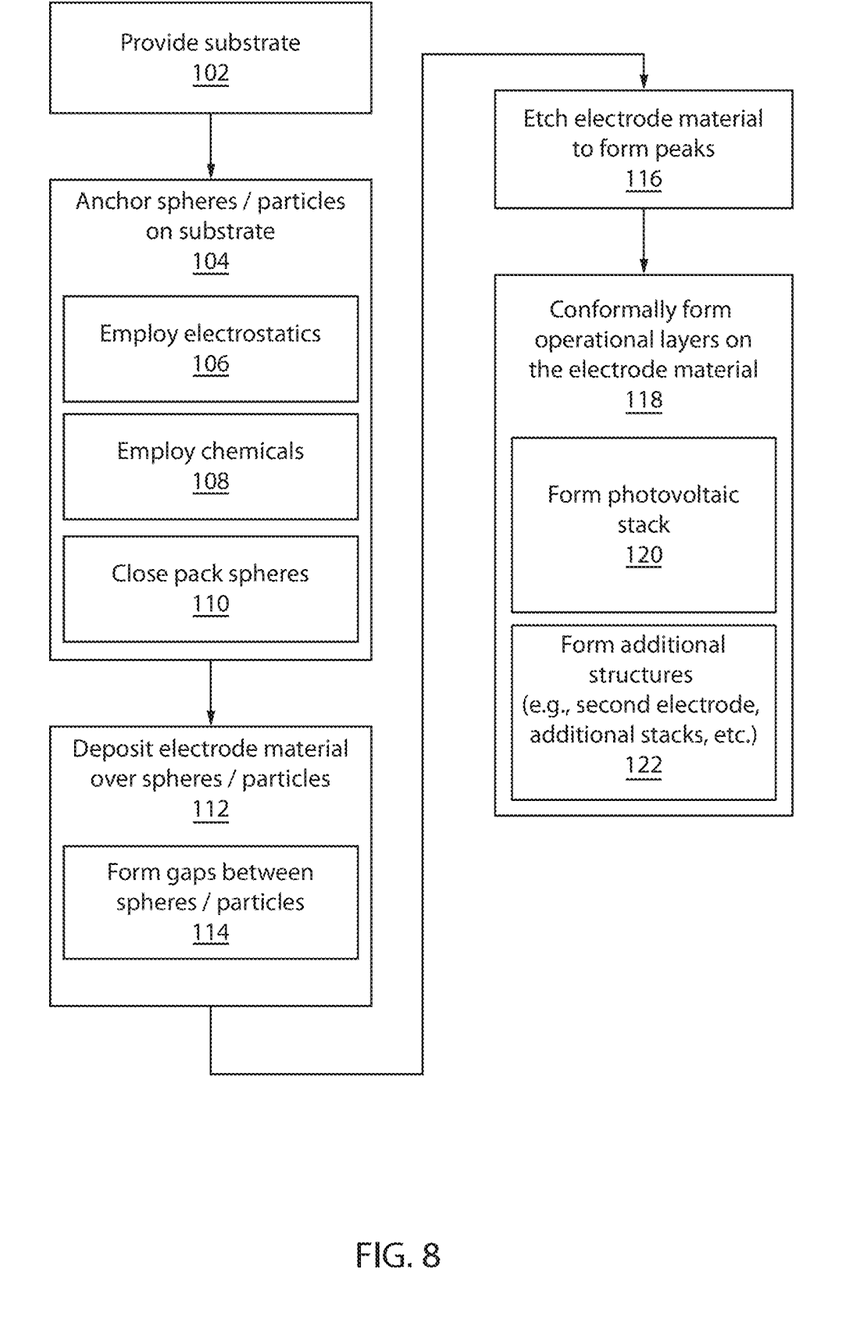
FIG. 8 is a flow diagram showing a method for fabricating a textured surface in accordance with the present principles.

Referring to FIG. 8, a method for forming a textured electrode surface for an electronic device is illustratively shown in accordance with exemplary embodiments. In block 102, a substrate is provided for an electronic device. The substrate may include a transparent material although opaque materials may also be employed depending on the application or orientation of the device. In one embodiment, the substrate may include glass, a semiconductor material (e.g., Si), a metal, etc. In block 104, a plurality of spheres or particles is anchored to the substrate. The plurality of spheres may include an average diameter between about 5 nm and 100 microns, and more preferably have an average diameter between about 50 nm and 5 microns. The plurality of spheres/particles may include at least one of polymeric polystyrene, silica, a metallic material. Other compatible materials may also be employed. It also should be noted that while spheres are preferred, other shaped particles may also be employed.

In block 106, anchoring includes employing electrostatic interaction between the spheres/particles and the substrate. This may include applying a charge or employing Van der Waals forces. In block 108, anchoring includes chemical anchoring the spheres/particles to the substrate. Chemicals may include, e.g., MPA, APTMS, etc. In block 110, anchoring a plurality of spheres to a substrate includes applying the spheres in a close packed configuration to provide a substantially uniform density of spheres. A layer by layer approach may be employed.

In block 112, an electrode material is deposited over the spheres/particles. The deposition process may include a CVD or PECVD process. The electrode materials may preferably include a transparent conductive oxide or a metal, preferably in a transparent configuration. In block 114, an electrode material may be deposited over the spheres/particles such that gaps and crevices are formed in the electrode material. The gaps or crevices in the electrode material caused by the spheres/particles are exploited while etching the electrode material to expand the gaps and crevices to form a textured surface having peaks.

In block 116, the electrode material is etched to form the peaks over the spheres/particles. The etching process may include a dry etch or a wet etch. The dry etch may include DRIE, and the wet etch may include HF or other acid etch. In block 118, one or more operational layers may be formed over the electrode material for performing a device function. In block 120, one embodiment includes a photovoltaic stack and the operational layers may include conformally forming a p-i-n stack over the electrode material for absorbing and converting radiation to current flow. In block 122, additional structures may be formed. In one embodiment, a second electrode may be formed over the p-i-n stack. Other structures may include passivation layers, reflective coatings, additional photovoltaic stacks, etc.

Having described preferred embodiments for a photovoltaic devices and methods using nano-spheres for textured electrodes (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a textured electrode for an electronic device, comprising:

electrostatically distributing and anchoring a plurality of particles to a substrate, wherein said electrostatic distributing comprises Van der Waals forces to provide a uniform distribution of particles on the substrate;

depositing transparent conductive electrode material over and in contact with the particles;

etching the electrode material to form peaks over the particles; and forming one or more active device layers over the electrode material for performing a device function.

2. The method as recited in claim 1, wherein anchoring includes employing electrostatic interaction between the particles and the substrate.

3. The method as recited in claim 1, wherein anchoring includes chemical anchoring the particles to the substrate.

4. The method as recited in claim 1, wherein depositing an electrode material includes depositing the electrode material over the particles such that gaps and crevices are formed in the electrode material and etching the electrode material includes etching the electrode material to expand the gaps and crevices to form a textured surface having the peaks.

5. The method as recited in claim 1, wherein the plurality of particles include spheres with an average diameter between about 5 nm and 100 microns.

6. The method as recited in claim 1, wherein the substrate and the electrode material include transparent materials.

7. The method as recited in claim 1, wherein anchoring a plurality of particles to a substrate includes applying spheres in a close packed configuration to provide a substantially uniform density of spheres.

8. The method as recited in claim 1, wherein the plurality of particles include at least one of polymeric polystyrene, silica, or a metallic material.

9. A method for forming a textured electrode for a photovoltaic device, comprising:

electrostatically distributing and anchoring a plurality of spheres to a substrate, wherein said electrostatic distributing comprises Van der Waals forces to provide a uniform distribution of particles on the substrate;

depositing transparent conductive electrode material over and in contact with the spheres;

etching the electrode material to form peaks over the spheres; and conformally forming a p-i-n stack over the electrode material for absorbing and converting radiation to current flow; and forming a second electrode over the p-i-n stack.

10. The method as recited in claim 9, wherein anchoring includes employing electrostatic interaction between the spheres and the substrate.

11. The method as recited in claim 9, wherein anchoring includes chemical anchoring the spheres to the substrate.

12. The method as recited in claim 9, wherein depositing an electrode material includes depositing the electrode material over the spheres such that gaps and crevices are formed in the electrode material and etching the electrode material includes etching the electrode material to expand the gaps and crevices to form a textured surface having the peaks.

13. The method as recited in claim 9, wherein the plurality of spheres include an average diameter between about 5 nm and 100 microns.

14. The method as recited in claim 9, wherein anchoring a plurality of spheres to a substrate includes applying the spheres in a close packed configuration to provide a substantially uniform density of spheres.

\* \* \* \* \*

UNITED STATES PATENT AND TRADEMARK OFFICE
CERTIFICATE OF CORRECTION

PATENT NO. : 8,916,409 B2  Page 1 of 1
APPLICATION NO. : 13/275936
DATED : December 23, 2014
INVENTOR(S) : Ahmed Abou-Kandil et al.

It is certified that error appears in the above-identified patent and that said Letters Patent is hereby corrected as shown below:

On the Title Page (73) Assignee should be listed as:

-- International Business Machines Corporation, Armonk, NY (US); Egypt Nanotechnology Center, Sheikh Zayed City (EG) --.

Signed and Sealed this
Fourteenth Day of April, 2015

Michelle K. Lee
*Director of the United States Patent and Trademark Office*